United States Patent
Yee

(10) Patent No.: US 11,240,933 B2
(45) Date of Patent: Feb. 1, 2022

(54) HEAT RADIATION SHEET

(71) Applicant: Samsung Display Co., Ltd., Yongin-si (KR)

(72) Inventor: Dong Su Yee, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 213 days.

(21) Appl. No.: 16/744,089

(22) Filed: Jan. 15, 2020

(65) Prior Publication Data

US 2020/0267874 A1 Aug. 20, 2020

(30) Foreign Application Priority Data

Feb. 19, 2019 (KR) .......................... 10-2019-0019024

(51) Int. Cl.
*H05K 7/20* (2006.01)

(52) U.S. Cl.
CPC ..... *H05K 7/20472* (2013.01); *H05K 7/20963* (2013.01)

(58) Field of Classification Search
CPC ............ H05K 7/20472; H05K 7/20963; H01L 23/3677; H01L 23/367; H01L 23/3735; H01L 23/3672; H01L 23/373; B32B 3/266; B32B 2307/30
See application file for complete search history.

(56) References Cited

U.S. PATENT DOCUMENTS 9,961,809 B1 5/2018 Yoon et al.

FOREIGN PATENT DOCUMENTS

| KR | 101181573 B1 | * | 9/2012 | |
|---|---|---|---|---|
| KR | 10-1509494 B1 | | 4/2015 | |
| KR | 1510109 B1 | * | 4/2015 | |
| KR | 2015120765 A | * | 10/2015 | |
| KR | 10-1743022 B1 | | 6/2017 | |
| KR | 10-2018-0011176 | | 1/2018 | |
| KR | 10-1883434 B1 | | 7/2018 | |
| KR | 10-1882817 B1 | | 8/2018 | |
| WO | WO-2016093617 A1 | * | 6/2016 | ............ B32B 15/08 |

* cited by examiner

*Primary Examiner* — Emmanuel E Duke
(74) *Attorney, Agent, or Firm* — Lewis Roca Rothgerber Christie LLP

(57) ABSTRACT

A heat radiation sheet includes: a film layer; a heat radiation layer on the film layer and having a first area, a second area, and a third area and a plurality of openings therein; and a first adhesive layer on the heat radiation layer. The openings include a plurality of first openings in the first area, a plurality of second openings in the second area, and a plurality of third openings in the third area, and an average distance between adjacent ones of the first openings is smaller than an average distance between adjacent ones of the third openings.

20 Claims, 11 Drawing Sheets

HEAT RADIATION SHEET

CROSS-REFERENCE TO RELATED APPLICATION

This application claims priority to and the benefit of Korean Patent Application No. 10-2019-0019024, filed on Feb. 19, 2019 in the Korean Intellectual Property Office, the disclosure of which is incorporated herein by reference in its entirety.

BACKGROUND

1. Field

Aspects of embodiments of the present invention relate to a heat radiation sheet.

2. Description of the Related Art

An electronic appliance may generate heat due to electronic components, such as wirings, terminals, and chips, therein. Heat generated by electronic components may shorten the lifetime (or lifespan) of an electronic appliance and may cause malfunctions and performance degradation. For example, in the case of a display device having a light source that generates a relatively large amount of heat, the accumulated heat is a major cause of deterioration of the display quality of the display device.

As electronic appliances, such as display devices and portable terminals, have greater performance and smaller size, electronic components therein are highly integrated, and thermal density increases with the high integration of the electronic components. Therefore, technology capable of effectively removing the generated heat is desired.

One example method of removing heat includes providing a heat radiation sheet including a heat radiation layer adjacent to electronic components that generate heat.

SUMMARY

An aspect of the present invention is to provide a heat radiation sheet having both an improved heat radiation function and excellent durability.

However, aspects and features of the present invention are not restricted to the those set forth herein. The above and other aspects and features of the present invention will become more apparent to one of ordinary skill in the art to which the present invention pertains by referencing the detailed description of the present invention given below.

An embodiment of a heat radiation sheet includes: a film layer; a heat radiation layer on the film layer and having a first area, a second area, and a third area and a plurality of openings therein; and a first adhesive layer on the heat radiation layer. The openings include a plurality of first openings in the first area, a plurality of second openings in the second area, and a plurality of third openings in the third area, and an average distance between adjacent ones of the first openings is smaller than an average distance between adjacent ones of the third openings.

An embodiment of a heat radiation sheet includes: a protective layer; a film layer on the protective layer; and a heat radiation layer on the film layer. The heat radiation layer includes an initial removal portion, a high-temperature portion, and a peripheral portion and has a plurality of openings therein. The openings include a plurality of first openings in the initial removal portion, a plurality of second openings in the high-temperature portion, and a plurality of third openings in the peripheral portion, and an average distance between adjacent ones of the first openings is smaller than an average distance between adjacent ones of the third openings.

BRIEF DESCRIPTION OF THE DRAWINGS

The above and other aspects and features of the present invention will become more apparent by describing, in detail, exemplary embodiments thereof with reference to the attached drawings, in which.

DETAILED DESCRIPTION

Figure 1:
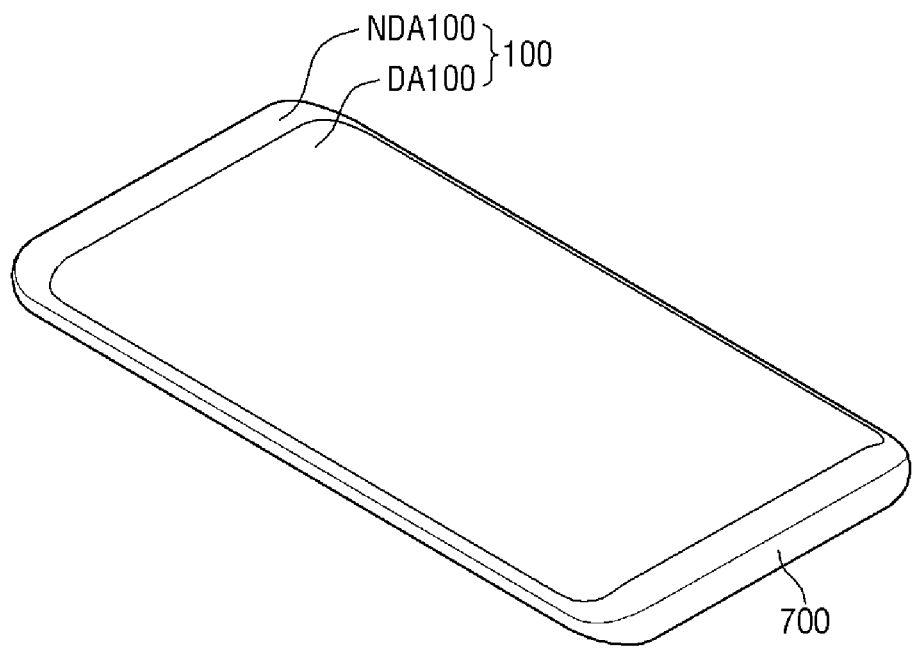
FIG. 1 is a perspective view of a display device including a heat radiation sheet according to an embodiment.
Figure 1:
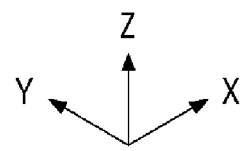

Aspects and features of the present invention and methods of accomplishing the same may be more readily understood with reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art. The present invention will be defined by the appended claims and their equivalents. Like reference numerals refer to like elements throughout the specification, and in the figures, dimensions of the various elements, layers, etc. may be exaggerated for clarity of illustration.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that when an element or layer is referred to as being "on," "connected to," or "coupled to" another element or layer, it can be directly on, connected, or coupled to the other element or layer or intervening elements or layers may be present. When an element is referred to as being "directly on," "directly connected to," or "directly coupled to" another element or layer, there are no intervening elements or layers present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments of the present invention described herein will be described with reference to plan views and cross-sectional views, which are ideal schematic views of the embodiments. Thus, illustrations may be modified by (e.g., may not reflect) manufacturing techniques and/or tolerances. Accordingly, embodiments of the present invention are not limited to specific forms and also include the variations caused by the associated manufacturing process(es). Therefore, the regions illustrated in the drawings have schematic attributes, and the shapes of the regions illustrated in the drawings are intended to illustrate specific types (or examples of types) of regions of the elements and are not intended to limit the scope of the present invention.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present invention will be described with reference to the attached drawings.

Figure 2:
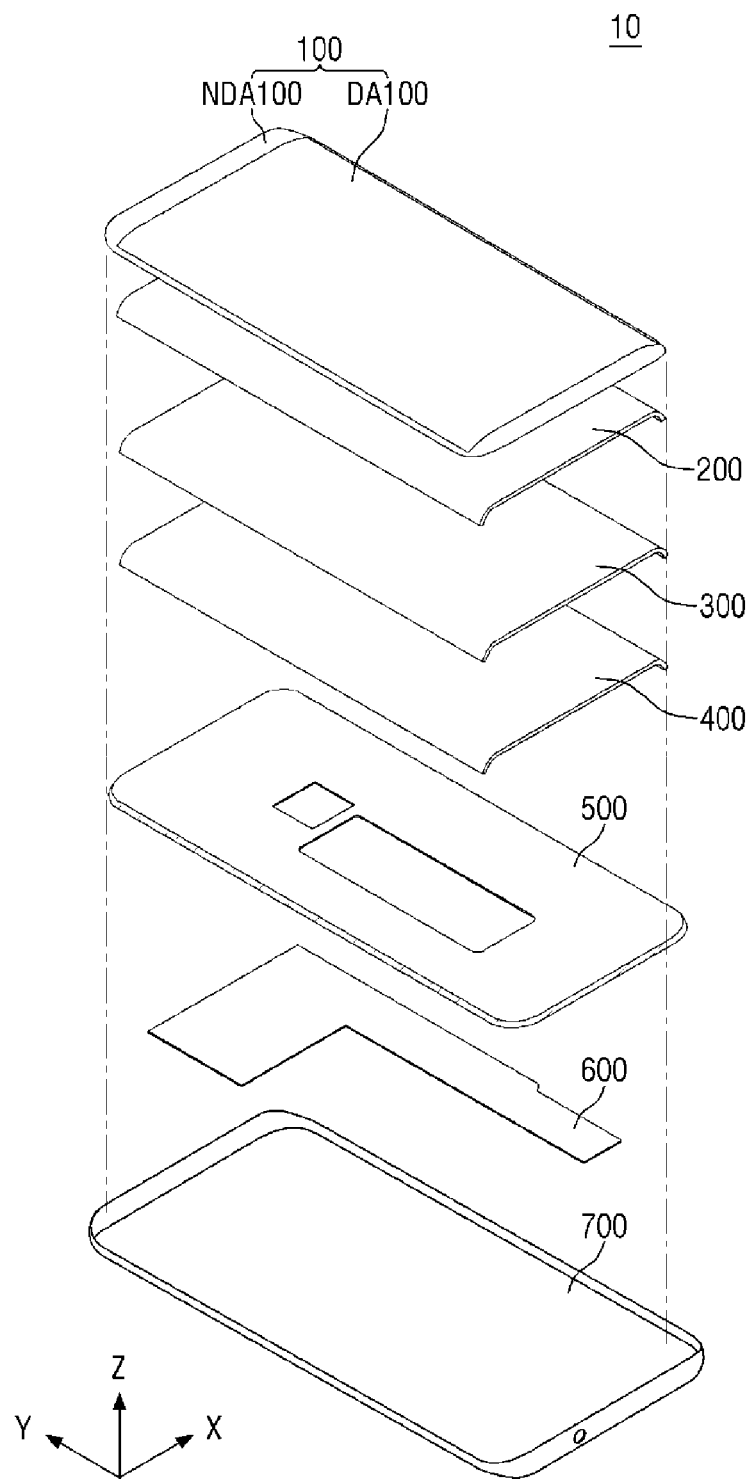
FIG. 2 is an exploded perspective view of the display device including the heat radiation sheet shown in FIG. 1.

FIG. 1 is a perspective view of a display device including a heat radiation sheet according to an embodiment, and FIG. 2 is an exploded perspective view of the display device including the heat radiation sheet shown in FIG. 1.

Referring to FIGS. 1 and 2, a display device 10 may be used as a display screen for various products, such as a mobile phone, a smart phone, a tablet personal computer (tablet PC), a smart watch, and a watch phone, each of which is a portable electronic appliance, as well as a notebook, a monitor, an Internet of thing (IOT) device, etc.

The display device 10 may be any one of an organic light emitting display device, a liquid crystal display device, a plasma display device, a field emission display device, an electrophoretic display device, an electrowetting display device, a quantum dot light emitting display device, and a micro-LED display device, but the present invention is not limited to these display devices. Hereinafter, as an example, the display device 10 will be mainly described as an organic light emitting display device, but the present invention is not limited thereto.

Referring to FIGS. 1 and 2, the display device 10 according to an embodiment includes a cover window 100, a display panel 200, a panel lower member 300, a heat radiation sheet 400, a middle frame 500, a main circuit board 600, and a lower cover 700.

In this specification, "on," "over," "top," "upper side," or "upper surface" refers to a direction in which the cover window 100 is disposed with respect to the display panel 200, for example, a third direction Z in FIGS. 1 and 2, and "beneath," "under," "bottom," "lower side," or "lower surface" refers to a direction in which the middle frame 500 is disposed with respect to the display panel 200, for example, a direction opposite to the third direction Z in FIGS. 1 and 2. Further, "left," "right," "upper," and "lower" refer to directions when the display device 10 is viewed from the plane. For example, "left" refers to a direction opposite to a first direction X in FIGS. 1 and 2, "right" refers to the first direction X in FIGS. 1 and 2, "upper" refers to the third direction Z in FIGS. 1 and 2, and "lower" refers to a direction opposite to the third direction Z in FIGS. 1 and 2.

The cover window 100 may be disposed on the display panel 200 to cover the upper surface of the display panel 200. Thus, the cover window 100 may function to protect the upper surface of the display panel 200. The cover window 100 may have a light transmitting area DA100 corresponding to the display panel 200 and a light blocking area NDA100 corresponding to an area other than the display panel 200. The light blocking area NDA100 may be opaque. In other embodiments, the light blocking area NDA100 may be a decorative layer having a pattern that may be displayed to (e.g., visible to) a user when an image is not displayed on the display panel 200. For example, a company's logos or various characters may be patterned in the light blocking area NDA100. Further, openings (e.g., holes) for exposing a front camera, an iris recognition sensor, an illumination sensor, and the like may be formed in the light blocking area NDA100.

The cover window 100 may include (or may be made of) glass, sapphire, and/or plastic. The cover window 100 may be rigid or flexible.

The display panel 200 may be disposed under the cover window 100. The display panel 200 may be disposed to overlap the light transmitting area DA100 of the cover window 100.

The display panel 200 may be a light emitting display panel including a light emitting element. For example, the display panel 200 may be an organic light emitting display panel using an organic light emitting diode, a micro light emitting diode display panel using a micro LED, or a quantum dot light emitting display panel using a quantum dot light emitting diode.

The display panel 200 may include a substrate, a thin film transistor layer disposed on the substrate, a light emitting element layer, and a thin film encapsulation layer.

Because the display panel 200 is flexible, it may include (or may be formed of) plastic. In such an embodiment, the substrate may include a flexible substrate and a support substrate. Because the support substrate supports the flexible substrate, the flexibility of the support substrate may be less flexible than the flexible substrate. Each of the flexible substrate and the support substrate may include a flexible polymer material. For example, each of the flexible substrate and the support substrate may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CAT), cellulose acetate propionate (CAP), or a combination thereof.

The thin film transistor layer is disposed on the substrate. The thin film transistor layer may include scan lines, data lines, and thin film transistors. Each of the thin film transistors includes a gate electrode, a semiconductor layer, a source electrode, and a drain electrode. When a scan driver is formed directly on the substrate, it may be formed together with (e.g., at the same time as) the thin film transistor layer.

The light emitting element layer is disposed on the thin film transistor layer. The light emitting element layer may include an anode electrode, a light emitting layer, a cathode electrode, and a bank. The light emitting element layer may include an organic light emitting element layer including an organic material. For example, the light emitting element layer may include a hole injection layer, a hole transporting layer, an organic light emitting element layer, an electron transporting layer, and an electron injection layer. The hole injection layer and the electron injection layer may be omitted. When a voltage is applied to the anode electrode and the cathode electrode, holes and electrons move to the organic light emitting element layer through the hole transporting layer and the electron transporting layer, respectively, and are combined with each other in the organic light emitting element layer to emit light. The light emitting element layer may be a pixel array layer in which pixels are formed, and thus, the area in which the light emitting element layer is formed may be defined as a display area in which an image is displayed. The peripheral area of the display area may be defined as a non-display area.

The thin film encapsulation layer is disposed on the light emitting element layer. The thin film encapsulation layer prevents oxygen and/or moisture from penetrating into the light emitting element layer. The thin film encapsulation layer may include one or more inorganic films and one or more organic films.

The panel lower member 300 may be disposed under the display panel 200. The panel lower member 300 may be attached to the lower surface of the display panel 200 by an adhesive layer. The adhesive layer may be an optically clear adhesive film (OCA) or an optically clear resin film (OCR).

The panel lower member 300 may include at least one of a light absorbing member for absorbing light incident from the outside, a buffer member for absorbing external impact, and an electromagnetic wave blocking member.

The light absorbing member inhibits the transmission of light to prevent the structures disposed under the light absorbing member from being viewed from at the top of the display panel 200 (e.g., to prevent them from being visible to a user). The light absorbing member may include a light absorbing material, such as a black pigment or a dye.

The buffer member absorbs an external impact to prevent or reduce instances of the display panel 200 being damaged. The buffer member may be formed of a single layer or may include a plurality of layers. For example, the buffer member may include (or may be made of) a polymer resin, such as polyurethane, polycarbonate, polypropylene, or polyethylene, or may include (or may be made of) an elastic material, such as a sponge formed by foam-molding a rubber, a urethane-based material, or an acrylic material. The buffer member may be a cushion layer.

The electromagnetic wave blocking member is a material having an electromagnetic wave blocking function. A metal foil generally used in the art may be used as the electromagnetic wave blocking member. For example, a copper foil, an aluminum foil, or a metal sheet may be used as the electromagnetic wave blocking member.

Figure 3:
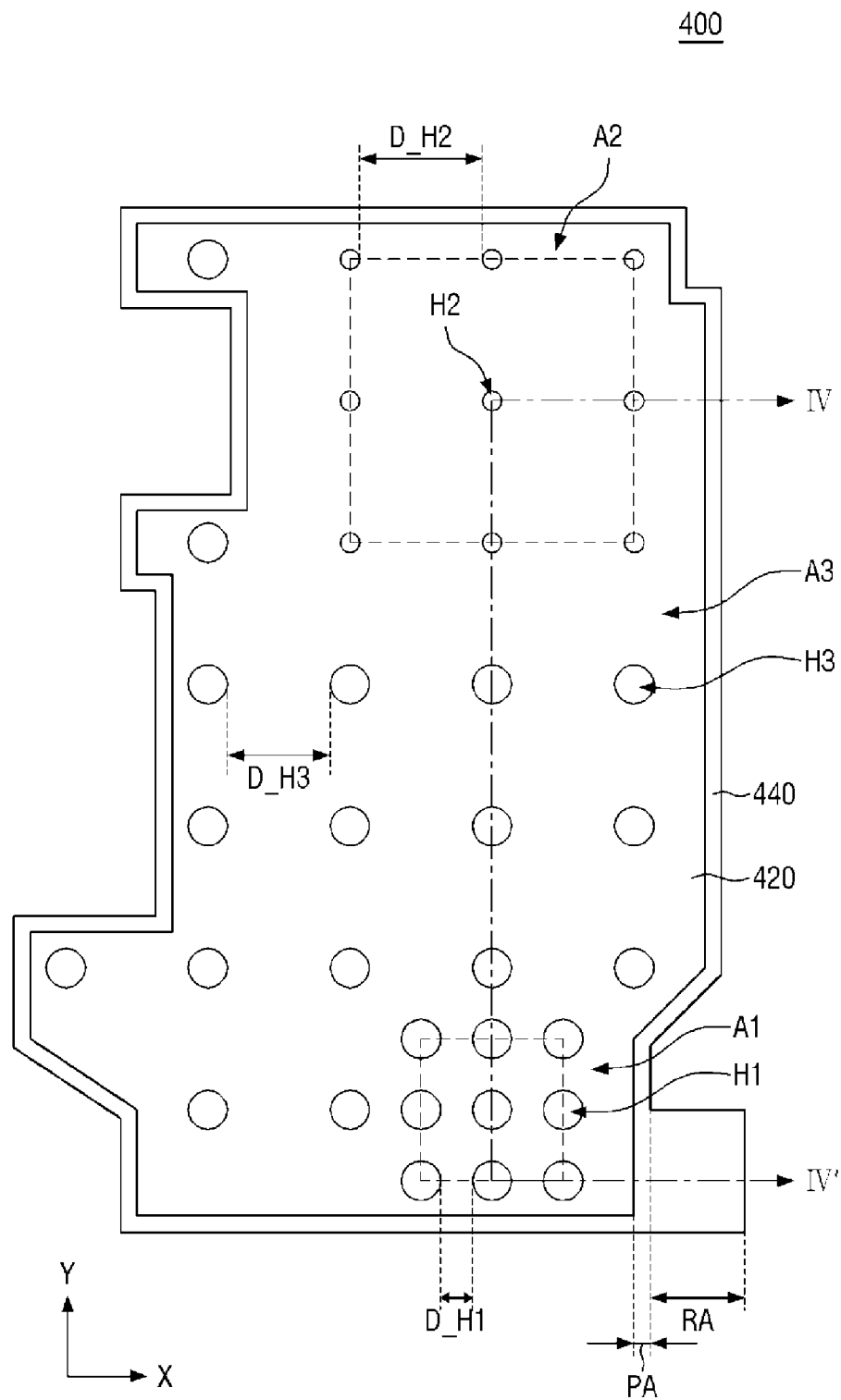
FIG. 3 is a plan view of the heat radiation sheet shown in FIG. 2.
Figure 4:
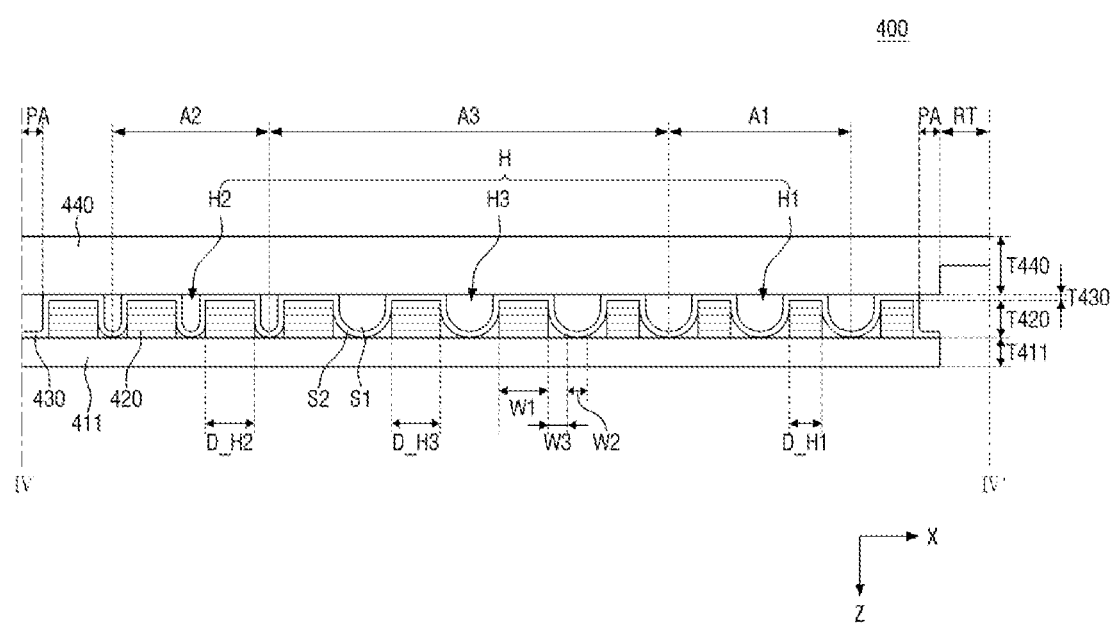
FIG. 4 is a cross-sectional view taken along the line IV-IV' of FIG. 3.

The heat radiation sheet 400 may be disposed below the panel lower member 300. The heat radiation sheet 400 may absorb and diffuse heat from a heat generating point (e.g., a heat generating component) to greatly reduce a heat generating temperature. Referring to FIGS. 3 and 4, the heat radiation sheet 400 may include an adhesive layer 411, a heat radiation layer 420 disposed under the adhesive layer 411, and a film layer 430 disposed under the heat radiation layer 420. Details of the heat radiation sheet 400 will be further described later.

The middle frame 500 may be disposed under the heat radiation sheet 400. The middle frame 500 may include a synthetic resin and/or a metal.

In the middle frame 500, an opening (e.g., a hole) into which a camera device, a sound generator, a battery, and/or the like is inserted may be formed. The main circuit board 600 may be disposed under the middle frame 500. The main circuit board 600 may be disposed under the middle frame 500. The main circuit board 600 may be a printed circuit board or a flexible printed circuit board.

The main circuit board 600 may include a main processor, a sound driver, a microphone, and a mobile communication module.

The lower cover 700 may be disposed under the middle frame 500 and the main circuit board 600. The lower cover 700 may be engaged and fixed to the middle frame 500. The lower cover 700 may form a lower surface appearance of the display device 10 (e.g., an outermost surface of the display device 10). The lower cover 700 may include plastic and/or metal.

Hereinafter, the heat radiation sheet 400 will be described in more detail.

FIG. 3 is a plan view of the heat radiation sheet shown in FIG. 2, and FIG. 4 is a cross-sectional view taken along the line IV-IV' of FIG. 3.

Referring to FIGS. 3 and 4, the heat radiation sheet 400 according to an embodiment may include a protective layer 440, a film layer 430 disposed on the protective layer 440, a heat radiation layer 420 disposed on the film layer 430, and a first adhesive layer 411 disposed on the heat radiation layer 420.

Compared with FIGS. 1 and 2, it should be noted that FIG. 4 shows an embodiment in which the top and bottom of the heat radiation sheet 400 are reversed. That is, the first adhesive layer 411 may be disposed on one side of the display panel 200, and the protective layer 440 may be disposed on one side of the middle frame 500.

FIG. 3 illustrates a planar shape of the heat radiation sheet 400 that may be used in (e.g., employed in) the display device 10, but the present invention is not limited thereto. The heat radiation sheet 400 according to an embodiment may have various sizes and shapes and may have, for example, a rectangular shape, a square shape, a rectangular shape having round vertices, a square shape having round vertices, an elliptic shape, or a circular shape.

The protective layer 440 may be a protective member for supporting the heat radiation layer 420 to reduce or minimize damage due to an external impact and to suppress infiltration of impurities, such as moisture, that may flow into the heat radiation sheet 400 from the outside.

The protective layer 440 may include a protruding area PA. The protruding area PA of the protective layer 440 may be an area at the side surface of the protective layer 440 that protrudes from (e.g., protrudes past or beyond) the side surface of the heat radiation layer 420. The cross-sectional width of the protruding area PA may be about 0.3 mm to about 0.5 mm but is not limited thereto. Details of the protruding area PA will be further described later.

The protective layer 440 may include a removal tab RT protruding and extending outwardly from one side surface thereof. The side surface of the removal tab RT may be disposed to protrude from (e.g., protrude past or beyond) the side surface of the film layer 430.

The protective layer 440 may be a layer that is removed when the heat radiation sheet 400 is applied to the display device 10. In this embodiment, the user may grip the removal tab RT of the protective layer 440 with his hand and remove the protective layer 440 from the layer disposed thereunder, for example, the film layer 430. Accordingly, the coupling force between the protective layer 440 and the layer disposed thereunder, for example, the film layer 430, may be set to such a degree that the protective layer 440 can be separated from the film layer 430 by hand.

Generally, defects, such as wrinkles and bubbles, may occur in the film layer 430 during the process of separating the protective layer 440 from the film layer 430. This phenomenon may more severely occur as the coupling force between the heat radiation layer 420 and the film layer 430 disposed under the protective layer 440 decreases. Details thereof will be described later.

Although it is shown in the drawings that the side surface of the protective layer 440, excluding the removal tabs RT, is aligned with the side surfaces of the film layer 430 and the first adhesive layer 411, the present invention is not limited thereto. For example, the planar area of the protective layer 440 may be larger than the planar area of the film layer 430 or the like so that the protective layer 440 may cover the film layer 430. In this embodiment, the side surface of the protective layer 440, excluding the removal tabs RT, may protrude outwardly from (e.g., protrude past or beyond) the side surface of the film layer 430.

The film layer 430 may be disposed on the protective layer 440. One surface of the film layer 430 may at least partially contact one surface of the protective layer 440. An adhesive layer is further disposed between the film layer 430 and the protective layer 440, and thus, one surface of the film layer 430 and one surface of the protective layer 440 may be attached to each other by the adhesive layer.

The film layer 430 may include a protruding area PA. The protruding area PA of the film layer 430 may be a portion of the side surface of the film layer 430 that protrudes from (e.g., protrudes past or beyond) the side surface of the heat radiation layer 420. For example, the film layer 430 may be wider than the heat radiation layer 420 to cover one surface of the heat radiation layer 420 disposed under the film layer 430. Thus, dust may not be generated from (e.g., may not adhere to) the heat radiation layer 420. Details thereof will be further described later.

One surface of the film layer 430 may include a first surface W1, a second surface W2, and a third surface W3.

The first surface W1 of the film layer 430 may be defined as an area where one surface of the film layer 430 and one surface of the heat radiation layer 420 contact each other.

The second surface W2 and third surface W3 of the film layer 430 may be defined as a surface disposed inside (e.g., an inner surface of) an opening (e.g., a through-hole) H in the heat radiation layer 420, which will be further described later.

The second surface W2 of the film layer 430 may be defined as an area of the film layer 430 that contacts the first adhesive layer 411 through the opening H in the heat radiation layer 420.

The third surface W3 of the film layer 430 may be defined as an area between the first surface W1 and the second surface W2, and the third surface W3 of the film layer 430 may at least partially contact the inner side wall of the heat radiation layer 420. Details thereof will be further described later.

The thickness T430 of the film layer 430 may be smaller than the maximum thickness T440 of the protective layer 440. The thickness T430 of the film layer 430 may be, but is not limited to, about 0.0055 mm to about 0.01 mm. When the thickness T430 of the film layer 430 is less than about 0.0055 mm, defects, such as wrinkles in the heat radiation sheet 400 may occur, and when the thickness T430 of the film layer 430 is greater than about 0.01 mm, the heat radiation sheet 400 may become less flexible.

The material of the film layer 430 is not particularly limited as long as it is a rigid material. For example, the film layer 430 may be a polymer film including (or formed of) polyimide (PI) or polyethylene terephthalate (PET). The film layer 430 may further include a black pigment or a dye.

The heat radiation layer 420 may be disposed on the film layer 430. One surface of the heat radiation layer 420 may at least partially contact one surface of the film layer 430. An adhesive layer may be further disposed between the heat radiation layer 420 and the film layer 430, and the one surface of the heat radiation layer 420 and the one surface of the film layer 430 may be attached to each other by the adhesive layer.

In an embodiment, the side surface of the heat radiation layer 420 may be disposed inwardly from the side surface of the film layer 430 such that the heat radiation layer 420 may not overlap the protruding area PA of the film layer 430. For example, the heat radiation layer 420 may be smaller than the film layer 430 in a plan view, and one surface of the heat radiation layer 420 may be covered by the film layer 430. In one embodiment, the film layer 430 may be disposed to cover not only the upper surface of the heat radiation layer 420 but also the side surface thereof. Thus, the side surface of the heat radiation layer 420 may not be exposed to the outside, and thus, the display device 10 may avoid defects due to the generation of dust from (e.g., the adherence of dust to) the heat radiation layer 420.

The heat radiation layer 420 may be a heat transfer member made of a material having a relatively high thermal conductivity. In an exemplary embodiment, the heat radiation layer 420 has a thermal conductivity in the thickness direction (e.g., the third direction Z) and a thermal conductivity in the horizontal direction (e.g., the first direction X and the second direction Y) that are different from each other. For example, in the heat radiation layer 420, the thermal conductivity in the horizontal direction may be greater than the thermal conductivity in the thickness direction. Thus, the heat radiation layer 420 may effectively transfer the absorbed heat in the horizontal direction (e.g., the plane direction).

The heat radiation layer 420 may include a carbon material, such as graphite, graphene, or carbon nanotube. In an exemplary embodiment, the heat radiation layer 420 may be a graphite film formed by carbonizing and graphitizing a polymer film, such as a polyimide film. Because graphite has a relatively very high thermal conductivity, the heat radiation characteristics of the heat radiation sheet 400 are further improved when graphite is applied to the heat radiation layer 420. In addition, because artificial graphite produced by carbonizing and graphitizing the polymer film may be formed to have a micro-sized thickness, the heat radiation sheet 400 may be thin.

The thickness T420 of the heat radiation layer 420 may be greater than the maximum thickness T440 of the protective layer 440 and the maximum thickness T430 of the film layer 430. For example, the thickness T420 of the heat radiation layer 420 may be about 0.025 mm to about 0.035 mm but is not limited thereto. In another embodiment, the heat radiation layer 420 may include (or may be made of) natural graphite.

The heat radiation layer 420 may include one or more openings (e.g., through-holes) H. The openings H may vertically penetrate (e.g., may vertically extend through) the heat radiation layer 420 in the thickness direction thereof to expose a portion of the first adhesive layer 411 disposed on the heat radiation layer 420.

The film layer 430 may be disposed to extend into the openings H. Accordingly, the film layer 430 may at least partially contact the first adhesive layer 411 exposed by the openings H. Further, the film layer 430 may at least partially contact the inner side wall of the heat radiation layer 420 in the openings H.

For example, the second surface W2 of the film layer 430 may contact one surface of the first adhesive layer 411 exposed by the openings H. Further, the third surface W3 of the film layer 430 may contact the inner side wall of the heat radiation layer 420 in the openings H. Thus, even when the heat radiation layer 420 is made of a material that is relatively vulnerable to damage in the third direction Z and is liable to peel off, the inner sidewall of the heat radiation layer 420 may contact one surface of the film layer 430 in the openings H such that the internal coupling force of the heat radiation layer 420 to the film layer 430 is improved and excellent physical and mechanical characteristics are imparted to the heat radiation sheet 400.

In an embodiment, a plurality of openings (e.g., through-holes) H may be spaced apart from each other in the first direction X and the second direction Y in the heat radiation layer 420. The first and second directions X and Y are orthogonal to each other in a plan view, and the openings H may be arranged in a substantially matrix arrangement.

The planar shape of each of the openings H is not particularly limited and may be, for example, substantially circular. However, the present invention is not limited thereto, and the openings H may have an elliptic shape or a polygonal shape in a plan view.

In an embodiment, the inner wall of the openings H may be substantially perpendicular to the upper surface or lower surface of the heat radiation layer 420. However, the present invention is not limited thereto, and the inner wall of the openings H may have an inclination (e.g., a predetermined inclination) with respect to the upper surface or the lower surface of the heat radiation layer 420.

The openings H may include a first space S1 and a second space S2.

The first space S1 of the openings H may be defined as a space formed by (e.g., surrounded or covered by) one surface of the film layer 430 and one surface of the protective layer 440.

The second space S2 of the openings H may be defined as a space formed by or between one surface of the first adhesive layer 411 exposed by the respective opening H, the inner side wall of the heat radiation layer 420, and the third surface W3 of the other surface of the film layer 430. The first space S1 of the openings H may be larger than the second space S2 thereof.

The openings H may include first openings (e.g., first holes) H1, second openings (e.g., second holes) H2, and third openings (e.g., third holes) H3. The first openings H1 may be disposed in a first area (e.g., an initial removal portion) A1 of the heat radiation layer 420, the second openings H2 may be disposed in a second area (e.g., a high-temperature portion) A2 of the heat radiation layer 420, the third openings H3 may be disposed in a third area (e.g., a peripheral portion) A3 of the heat radiation layer 420.

The first area A1 is an area adjacent to the removal tab RT of the protective layer 440. The shortest distance between the removal tab RT of the protective layer 440 and the center of the first area A1 may be smaller than the shortest distance between the removal tab RT of the protective layer 440 and the center of the second area A2 and/or the center of the third area A3.

The first area A1 may be an area that is initially removed (or removed first) when the protective layer 440 is removed from the film layer 430. For example, the protective layer 440 disposed in the first area A1 may be removed from the film layer 430 before the protective layer 440 disposed in the second area A2 and the third area A3.

Generally, in the process of removing the protective layer 440 from the film layer 430, the film layer 430 may be separated from the heat radiation layer 420 and then expanded and contracted. In this process, wrinkles may occur in the film layer 430 and additional defects, such as the formation of bubbles, may occur when the contracting process is insufficient.

Moreover, in the first area A1, the initial force due to peeling of the protective layer 440 may be relatively high, and defects, such as wrinkles and bubbles, may also be most severe in the first area A1.

Thus, in the heat radiation sheet 400 according to an embodiment, the distances between the first openings H1 arranged in the first area A1 are relatively small (e.g., the openings H1 in the first area A1 are relatively densely arranged), and thus, the formation of wrinkles or bubbles in the heat radiation sheet 400 may be substantially reduced or prevented.

For example, the distance D_H1 between the first openings H1 may be different from the distance D_H2 between the second openings H2 and/or the distance D_H3 between the third openings H3. Here, the distance between the openings may be defined as an average distance between adjacent openings.

In an embodiment, the distance D_H1 between the first openings H1 may be smaller than the distance D_H3 between the third openings H3. Further, the distance D_H1 between the first openings H1 may be smaller than the distance D_H2 between the second openings H2.

The number of the first openings H1 arranged in the same area may be different from the number of the third openings H3 and/or the second openings H2 arranged in the same area (e.g., in a same amount of surface area). For example, the first openings H1 may arranged more or less densely than the third openings H3 and/or the second openings H2.

In an embodiment, the number of first openings H1 arranged in the same area may be greater than the number of the third openings H3 arranged in the same area (e.g., the first openings H1 may be arranged more densely than the third openings H3). Further, the number of the first openings H1 arranged in the same area may be greater than the number of the second openings H2 arranged in the same area (e.g., the first openings H1 may be arranged more densely than the second openings H2).

The planar area S_H1 of the first openings H1 may be substantially equal to the planar area S_H3 of the third openings H3.

As described above, when the first openings H1 are arranged in the first area A1 at relatively dense intervals, the coupling force between the heat radiation layer 420 and the film layer 430 is further improved. Accordingly, even when a relatively large initial force is applied to the first area A1, separation of the film layer 430 from the heat radiation layer 420 may be prevented or reduced, and thus, the formation of wrinkles or bubbles in the film layer 430 may be substantially reduced or prevented.

The second area A2 is an area overlapping a high temperature member from which heat is emitted in the display device 10. For example, the center of the second area A2 may be an area in which an integrated circuit, a driving chip, a light source, a sensor, a battery, and the like of the display device 10 are arranged. The second area A2 may have higher thermal density than the third area A3 and/or the first area A1, and the accumulated heat may cause deterioration in display quality of the display device 10.

Thus, in the heat radiation sheet 400 according to an embodiment, the area of the second openings H2 disposed in the second area A2 may be reduced to shorten a heat transfer path in the horizontal direction, and thus, the heat radiation characteristics of the heat radiation sheet 400 are improved.

For example, the planar area S_H2 of the second openings H2 may be different from the planar area S_H3 of the third openings H3 and/or the planar area S_H1 of the first openings H1.

In an embodiment, the planar area S_H2 of the second openings H2 may be smaller than the planar area S_H3 of the third openings H3. Further, the planar area S_H2 of the second openings H2 may be smaller than the planar area S_H1 of the first openings H1.

The distance D_H2 between the second openings H2 may be different from the distance D_H3 between the third openings H3 and the distance D_H1 between the first openings H1.

In an embodiment, the distance D_H2 between the second openings H2 may be greater than the distance D_H3 between the third openings H3. Further, the distance D_H2 between the second openings H2 may be greater than the distance D_H1 between the first openings H1.

The number of the second openings H2 arranged in the same area may be substantially equal to the number of the third openings H3 arranged in the same area.

As described above, when the area of the second openings H2 arranged in the second region A2 is relatively small, the heat transfer path in the horizontal direction in the heat radiation layer 420 may be shortened. Accordingly, the thermal diffusion performance of the heat radiation sheet 400 in the horizontal direction is improved, and thus, the heat radiation characteristics of the heat radiation sheet 400 are further improved.

The first area A1, the second area A2, and the third area A3 are not limited to the positions shown in FIGS. 3 and 4, and the relative positions of the first area A1, the second area A2, and the third area A3 may be variously, suitably changed.

As described above, the heat radiation characteristics and durability of the heat radiation sheet 400 may differ depending on (e.g., depending on the size, location, etc. of) the first area A1, the second area A2, and the third area A3. In the heat radiation sheet 400 according to an embodiment, the openings H may be designed differently in the first area A1, the second area A2, and the third area A3 to improve the heat radiation characteristics of the heat radiation sheet 400, and the formation of wrinkles or bubbles may be reduced or prevented to improve the reliability of the heat radiation sheet 400.

The first adhesive layer 411 may be disposed under the heat radiation layer 420. One surface of the first adhesive layer 411 may contact the heat radiation layer 420 and the film layer 430, and the other surface of the first adhesive layer 411 may contact one surface of the panel lower member 300.

The first adhesive layer 411 may attach one surface of the heat radiation layer 420 to the panel lower member 300. Further, the first adhesive layer 411 may attach one surface of the film layer 430 to the panel lower member 300.

The first adhesive layer 411 may include a protruding area PA. The protruding area PA of the first adhesive layer 411 may be an area where the side surface of the first adhesive layer 411 protrudes from (e.g., protrudes past or beyond) the side surface of the heat radiation layer 420. For example, the first adhesive layer 411 may be formed to be wider than the heat radiation layer 420 in a plan view. In the protruding area PA, the first adhesive layer 411 may contact the film layer 430.

The first adhesive layer 411 may include a material having adhesive force. For example, the first adhesive layer 411 may include a thermosetting resin.

The thickness T411 of the first adhesive layer 411 may be greater than the thickness T430 of the film layer 430. Further, the thickness T411 of the first adhesive layer 411 may be smaller than the thickness T420 of the heat radiation layer 420. In an embodiment, the thickness T411 of the first adhesive layer 411 may be about 0.02 mm to about 0.03 mm but is not limited thereto.

The thermal conductivity of the first adhesive layer 411 may be less than the thermal conductivity of the heat radiation layer 420.

In FIG. 4, one surface of the first adhesive layer 411 is flat, and thus, the second space S2 exists between the first adhesive layer 411 and the film layer 430. However, the present invention is not limited thereto, and a portion or all of the second space S2 may be filled with the first adhesive layer 411. When the second space S2, that is, the openings H in the heat radiation layer 420, is filled with the first adhesive layer 411, the first adhesive layer 411 and the inner side wall of the heat radiation layer 420 may further contact each other. Thus, the peeling strength of the heat radiation layer 420 is improved.

When the second space S2 is filled with the first adhesive layer 411, the contact area between the film layer 430 and the first adhesive layer 411 may be further increased. Thus, the adhesive force between the film layer 430 and the first adhesive layer 411 is further improved, and thus, the heat radiation sheet 400 having excellent durability is provided. Moreover, during the process of peeling the protective layer 440 from the film layer 430, the separation of the film layer 430 from the first adhesive layer 411 may be prevented, and thus, the formation of wrinkles or bubbles in the film layer 430 may be reduced or prevented.

Hereinafter, other embodiments of the present invention will be described. In the following embodiments, the same configurations (e.g., the same elements, components, etc.) as those described above are referred to with the same reference numerals, and redundant descriptions thereof may be omitted or simplified.

Figure 5:
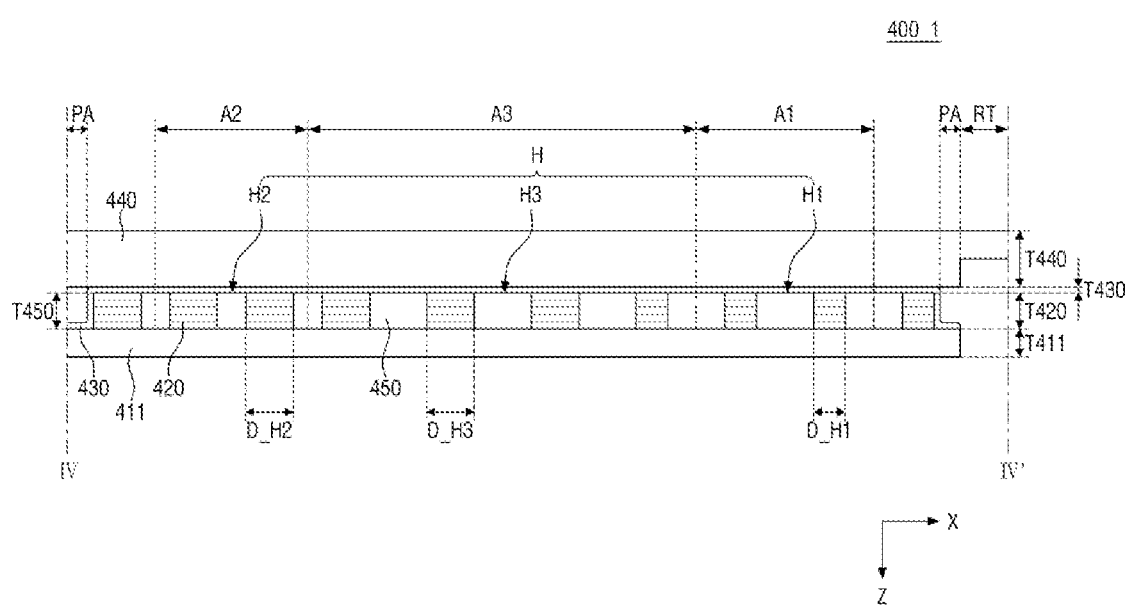
FIG. 5 is a cross-sectional view of a heat radiation sheet according to an embodiment.

FIG. 5 is a cross-sectional view of a heat radiation sheet according to another embodiment. Referring to FIG. 5, a heat radiation sheet 400_1 according to the present embodiment is different from the heat radiation sheet 400 according to the embodiment shown in FIG. 4 in that a filling layer 450 is further disposed between the film layer 430 and the first adhesive layer 411. One surface of the filling layer 450 may contact one surface of the film layer 430, and the other surface of the filling layer 450 may contact one surface of the first adhesive layer 411.

The filling layer 450 may include an organic material. The filling layer 450 may include a transparent material, such as a photocurable resin (e.g., a UV-curable resin) or a thermosetting resin. Examples of the photocurable resin include an epoxy acrylate resin, a urethane acrylate resin, and a silicone acrylate resin. Examples of the thermosetting resin include an acrylic resin, a urethane resin, and a polyester resin.

The maximum thickness T450 of the filling layer 450 may be greater than the maximum thickness T440 of the protective layer 440 and the maximum thickness T430 of the film layer 430. The maximum thickness T450 of the filling layer 450 may be smaller than or substantially equal to the thickness T420 of the heat radiation layer 420. In an embodiment, the maximum thickness T450 of the filling layer 450 may be about 0.025 mm to about 0.035 mm but is not limited thereto.

The openings H formed in the heat radiation layer 420 may be filled with filling layer 450. The filling layer 450 may contact the inner side wall of the heat radiation layer 420 in the openings H. Accordingly, the durability of the heat radiation sheet 400_1 is further improved. For example, when the heat radiation layer 420 is made of a material that is relatively vulnerable to damage in the third direction Z and is liable to peel off, the side surface of the filling layer 450 may contact the inner sidewall of the heat radiation layer 420 in the openings H so that the internal coupling force of the heat radiation layer 420 is improved and excellent physical and mechanical characteristics are imparted to the heat radiation sheet 400_1.

The upper surface of the filling layer 450 may be flat as shown in FIG. 5. The film layer 430 may be disposed to cover the filling layer 450. In this embodiment, because the film layer 430 may contact the upper surface of the flat filling layer 450, the contact area between the filling layer 450 and the film layer 430 may be further increased. Accordingly, because the film layer 430 and the filling layer 450 may be more firmly coupled with each other, as described above, during the process of peeling the protective layer 440 from the film layer 430, the film layer 430 may not be separated from the underlying layers, for example, the heat radiation layer 420 and the filling layer 450, so that defects, such as wrinkles or bubbles, may be prevented or substantially reduced.

Similar to the heat radiation sheet 400 described above with respect to FIGS. 1-4, the heat radiation layer 420 of the heat radiation sheet 400_1 according to the present embodiment includes the first area A1, the second area A2, and the third area A3, and the openings H are designed differently depending on (e.g., depending on their location in) the first area A1, the second area A2, and the third area A3 so that the heat radiation characteristics of the heat radiation sheet 400_1 are improved and defects, such as wrinkles or bubbles, may be prevented or substantially reduced.

Figure 6:
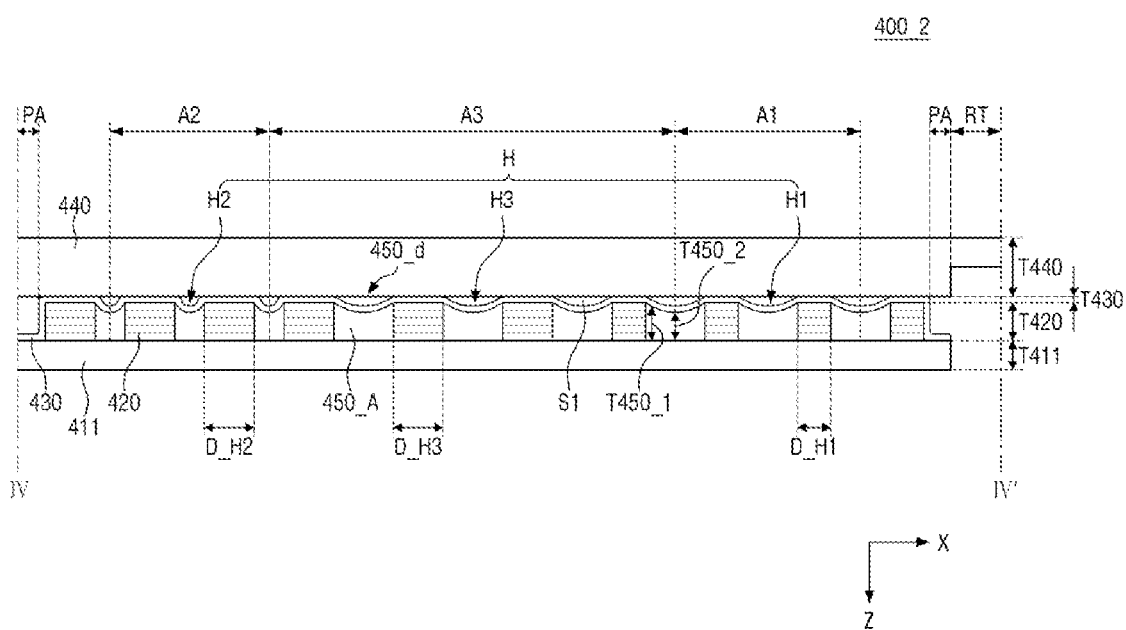
FIG. 6 is a cross-sectional view of a heat radiation sheet according to an embodiment.

FIG. 6 is a cross-sectional view of a heat radiation sheet according to another embodiment.

Referring to FIG. 6, a heat radiation sheet 400_2 according to the present embodiment is different from the heat radiation sheet 400_1 according to the embodiment shown in FIG. 5 in that the upper surface of a filling layer 450_A includes a depression portion 450_d that is recessed in the depth direction (e.g., third direction Z).

The thickness of the depression portion 450_d of the filling layer 450_A is relatively large at both ends (e.g., at an outer edge) thereof and is reduced (e.g., is relatively small) toward the center thereof from both ends (e.g., from the outer edge) thereof. The thickness of the depression portion 450_d may be the smallest at the center in the width direction in a cross-sectional view.

The depression portion 450_d of the filling layer 450_A has a first thickness T450_1 at the end (e.g., at the outer edge) that is the largest thickness and a second thickness T450_2 at the center that is the lowest height (e.g., the smallest thickness). Here, the first thickness T450_1 and the second thickness T450_2 are defined as vertical distances (e.g., distances in the third direction Z) from the upper surface of the filling layer 450_A to the bottom surface thereof (or an extending surface of the bottom surface). When the bottom surface of the filling layer 450_A is flat, the first thickness T450_1 is greater than the second thickness T450_2. And even when the bottom surface of the filling layer 450_A has a concave or another shape, the first thickness T450_1 may be greater than the second thickness T450_2.

The first thickness T450_1 of the depression portion 450_d of the filling layer 450_A may be smaller than or equal to the thickness T420 of the heat radiation layer 420. The first thickness T450_1 of the depression portion 450_d being equal to the thickness T420 of the heat radiation layer 420 means that the upper surface of the filling layer 450_A is connected to one end of (e.g., contacts to an upper surface of) the heat radiation layer 420. When the first thickness T450_1 of the depression portion 450_d is smaller than the thickness T420 of the heat radiation layer 420, the upper surface of the filling layer 450_A may be spaced apart from one end of (e.g., spaced apart from or recessed below the upper surface of) the heat radiation layer 420.

The openings H may include the first space S1 in an area where the film layer 430 overlaps the depression portion 450_d of the filling layer 450_A. The first space S1 may be formed by (e.g., surrounded or covered by) one surface of the protective layer 440 and one surface of the film layer 430. Because the film layer 430 and the protective layer 440 are separated from each other with the first space S1 therebetween, the contact area between the film layer 430 and the heat radiation layer 420 and between the film layer 430 and the filling layer 450_A may be larger than the contact area between the film layer 430 and the protective layer 440. Thus, the coupling force between the film layer 430 and the heat radiation layer 420 and between the film layer 430 and the filling layer 450_A may be greater than the coupling force between the film layer 430 and the protection layer 440. Accordingly, the protective layer 440 may be more easily peeled from the film layer 430, and the separation of the film layer 430 from the heat radiation layer 420 and the filling layer 450_A may be prevented, thereby preventing or substantially reducing defects, such as wrinkles or bubbles.

The film layer 430 may be disposed to cover the heat radiation layer 420 and the filling layer 450_A. The film layer 430 may contact the upper surface of the depression portion 450_*d* of the filling layer 450_A. Further, the film layer 430 may not contact the protective layer 440 in an area overlapping the depression portion 450_*d* of the filling layer 450_A (e.g., at the first space S1).

Similar to the heat radiation sheet 400 described above with respect to FIGS. 1-4, the heat radiation layer 420 of the heat radiation sheet 400_2 according to the present embodiment includes the first area A1, the second area A2, and the third area A3, and the openings H are designed differently depending on (e.g., depending on their location in) the first area A1, the second area A2, and the third area A3 so that the heat radiation characteristics of the heat radiation sheet 400_2 are improved and defects, such as wrinkles or bubbles, may be prevented or substantially reduced.

Figure 7:
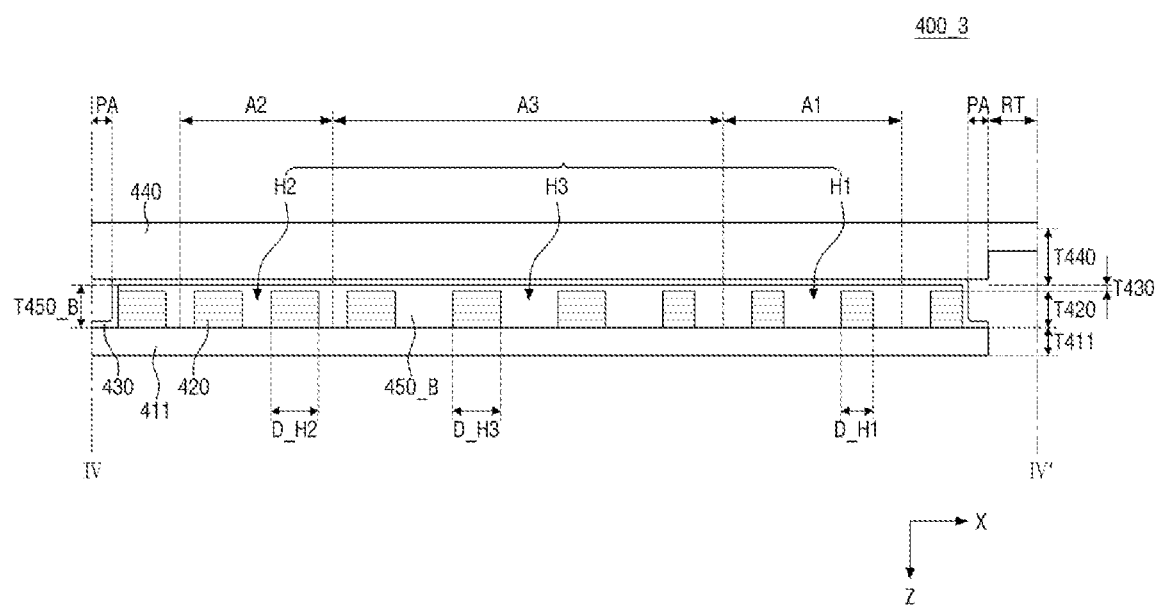
FIG. 7 is a cross-sectional view of a heat radiation sheet according to an embodiment.

FIG. 7 is a cross-sectional view of a heat radiation sheet according to another embodiment.

Referring to FIG. 7, a heat radiation sheet 400_3 according to the present embodiment is different from the heat radiation sheet 400 according to the embodiment shown in FIG. 4 in that a filling layer 450_B is further disposed between the film layer 430 and the heat radiation layer 420.

The maximum thickness T450B of the filling layer 450_B may be greater than the thickness T420 of the heat radiation layer 420. Accordingly, the filling layer 450_B may be disposed to cover one surface of the heat radiation layer 420. For example, the filling layer 450_B may contact the upper surface of the heat radiation layer 420 and the inner side wall of the heat radiation layer 420 in the openings H. In this embodiment, when the heat radiation layer 420 is made of a material that is relatively vulnerable to damage in the third direction Z and is liable to peel off, the filling layer 450_B may directly contact the upper surface of the heat radiation layer 420 and the inner sidewall of the heat radiation layer 420. Thus, the internal coupling force of the heat radiation layer 420 is improved and excellent physical and mechanical characteristics are imparted to the heat radiation sheet 400_3.

The upper surface of the filling layer 450_B may be a flat surface (e.g., a continuous flat surface). The film layer 430 may be disposed to cover the filling layer 450_B. In this embodiment, because the film layer 430 may contact the upper surface of the flat filling layer 450_B, the contact area between the filling layer 450_B and the film layer 430 may be further increased. Accordingly, because the film layer 430 and the filling layer 450_B may be more firmly coupled to each other, as described above, the film layer 430 may not be separated from the filling layer 450_B during the process of peeling the protective layer 440 from the film layer 430 so that defects, such as wrinkles or bubbles, may be prevented or substantially reduced.

In an embodiment, the film layer 430 may not contact the upper surface of the heat radiation layer 420. Further, the film layer 430 may at least partially contact the side surface of the heat radiation layer 420.

Similar to the heat radiation sheet 400 described above with respect to FIGS. 1-4, the heat radiation layer 420 of the heat radiation sheet 400_3 according to the present embodiment includes the first area A1, the second area A2, and the third area A3, and the openings H are designed differently depending on (e.g., depending on their location in) the first area A1, the second area A2, and the third area A3 so that the heat radiation characteristics of the heat radiation sheet 400_3 are improved and defects, such as wrinkles or bubbles, may be prevented or substantially reduced.

Figure 8:
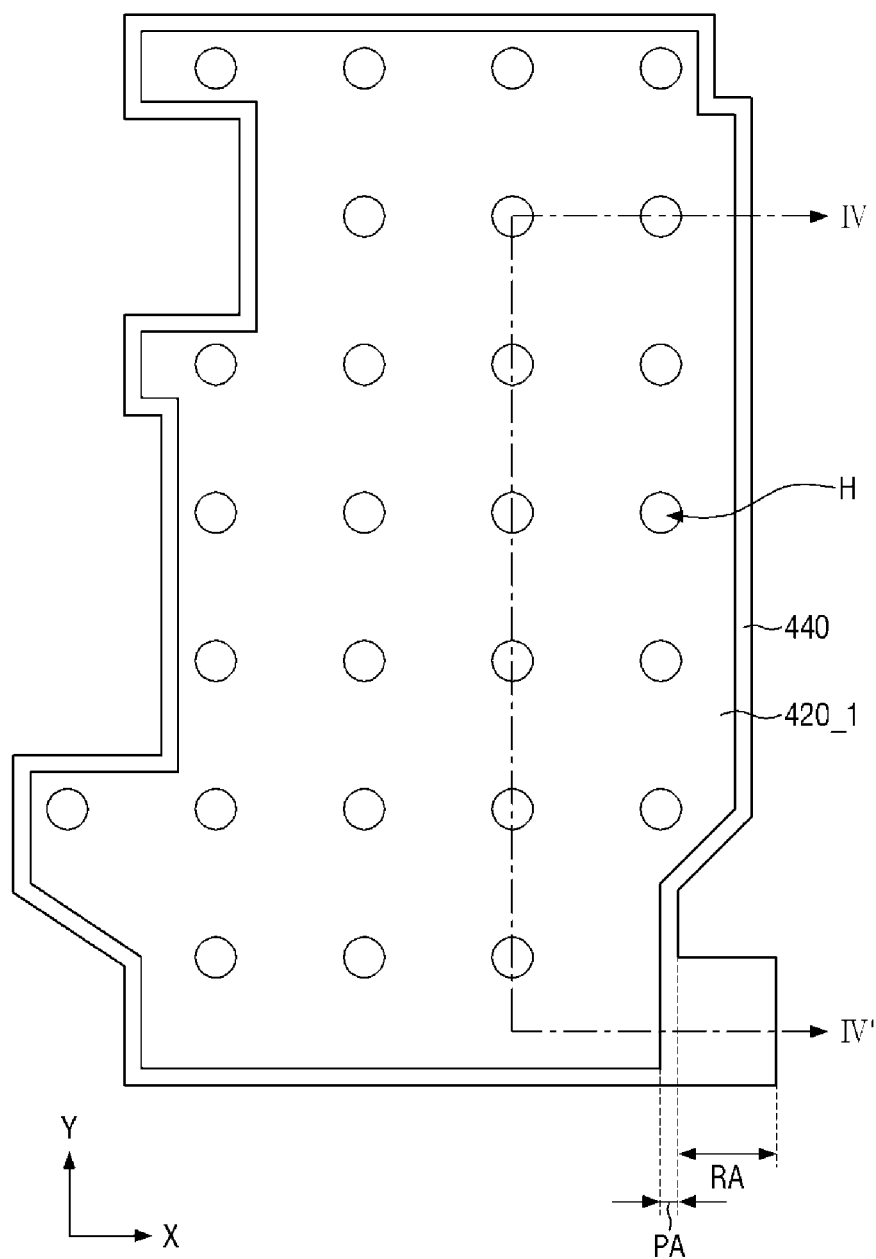
FIG. 8 is a plan view of a heat radiation sheet according to an embodiment.
Figure 9:
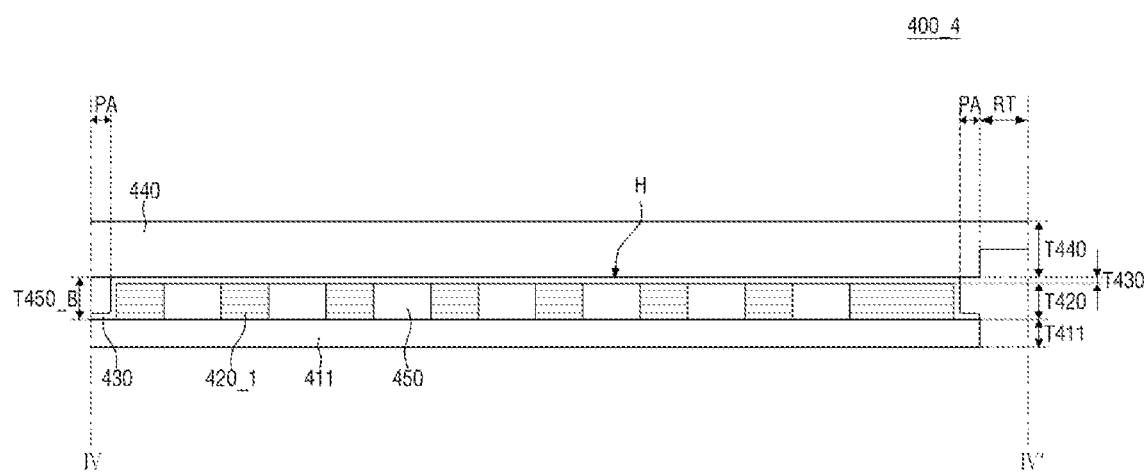
FIG. 9 is a cross-sectional view of the heat radiation sheet shown in FIG. 8.

FIG. 8 is a plan view of a heat radiation sheet according to another embodiment, and FIG. 9 is a cross-sectional view of the heat radiation sheet shown in FIG. 8.

Referring to FIGS. 8 and 9, a heat radiation sheet 400_4 according to the present embodiment is different from the heat radiation sheet 400_1 according to the embodiment shown in FIG. 5 in that openings H in a heat radiation layer 420_1 are regularly arranged in a plan view.

For example, the openings H in the heat radiation layer 420_1 may be arranged in a substantially matrix arrangement in which the openings H are spaced apart from each other in the first direction X and the second direction Y. The distance between the openings H in the first direction X and/or the distance between the openings H in the second direction Y may be constant, and the distance between the openings H in the first direction X may be substantially equal to the distance between the openings H in the second direction Y. The openings H may be regularly arranged in a plan view, and thus, the thermal conductivity the heat radiation layer 420_1 in the horizontal direction may be uniformly maintained. Further, the distance between the openings H in the first direction X and/or the distance between the openings H in the second direction Y may be constant, but the distance between the openings H in the first direction X may be different from the distance between the openings H in the second direction Y.

The shape and/or areas of the openings H in the heat radiation layer 420_1 in a plan view may be constant.

The filling layer 450 may be disposed in the openings H. The filling layer 450 may contact the inner side wall of the heat radiation layer 420_1 in the openings H. Accordingly, as described above, when the heat radiation layer 420_1 is made of a material that is relatively vulnerable to damage in the third direction Z and is liable to peel off, the internal coupling force of the heat radiation layer 420_1 is improved and excellent physical and mechanical characteristics are imparted to the heat radiation sheet 400_4.

Next, a method of manufacturing a heat radiation sheet according to an embodiment will be described. A method of manufacturing the heat radiation sheet 400 shown in FIGS. 1-4 will be described as an example. Components that are substantially the same as those described above with respect to FIGS. 1-4 are denoted by the same reference numerals, and detailed descriptions thereof may be omitted.

FIGS. 10-13 are cross-sectional views illustrating a method of manufacturing a heat radiation sheet according to an embodiment. The following cross-sectional views are cross-sectional views taken along a line corresponding to the line IV-IV' in FIG. 4.

Figure 10:
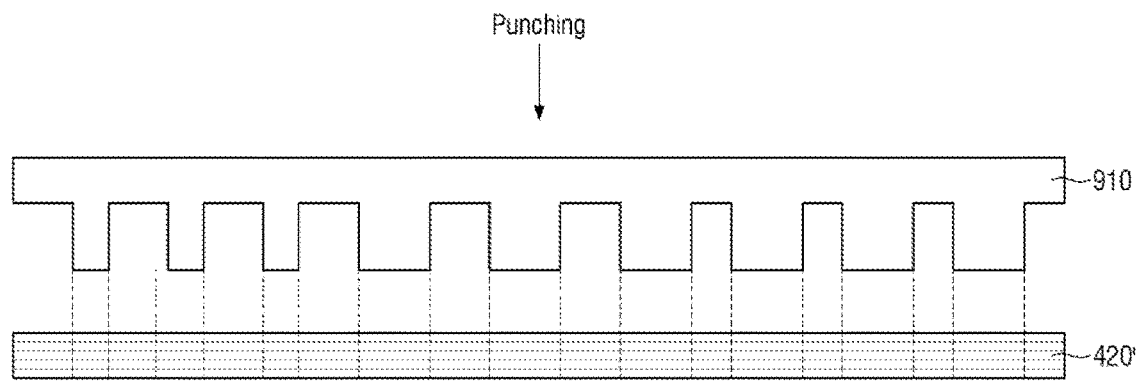
FIGS. 10-13 are cross-sectional views illustrating a method of manufacturing a heat radiation sheet according to an embodiment.

Referring to FIG. 10, first, a heat radiation layer 420' is prepared, and one or more openings (e.g., through-holes) H are formed in the heat radiation layer 420'. The process of forming the openings H may be a process of punching the heat radiation layer 420' by using a mold 910 having a shape corresponding to the openings H.

For example, the planar area of the openings H and the distance between the openings H may be designed differently depending on (e.g., depending on the location of the openings H in) the first area A1, the second area A2, and the third area A3. Accordingly, as described above, the heat radiation characteristics of the heat radiation sheet 400 are improved and the occurrence of wrinkles or bubbles may be prevented or substantially reduced, thereby improving the reliability of the heat radiation sheet 400.

Because the heat radiation layer 420' is the same or substantially the same as the heat radiation layer 420 described above with reference to FIG. 4 and the like, except that the openings H are not yet formed therein, a detailed description thereof will be omitted.

Figure 11:
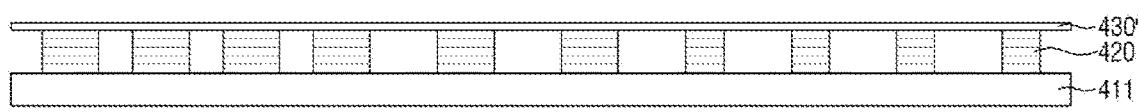

Subsequently, referring to FIG. 11, a film layer 430' is formed on one surface (e.g., an upper surface) of the heat radiation layer 420, and a first adhesive layer 411 is formed on the other surface of the heat radiation layer 420. The film layer 430' may be a polymer film, such as a polyethylene terephthalate film. An adhesive layer is further formed on one surface of the film layer 430', and the film layer 430' may be attached to the upper surface of the heat radiation layer 420 by the adhesive layer. The first adhesive layer 411 may include (or may be made of) a thermosetting resin. Because the film layer 430' is the same or substantially the same as the film layer 430 described above with reference to FIG. 4 and the like, except that it is not yet disposed in the openings H of the heat radiation layer 420, a detailed description thereof will be omitted.

Figure 12:
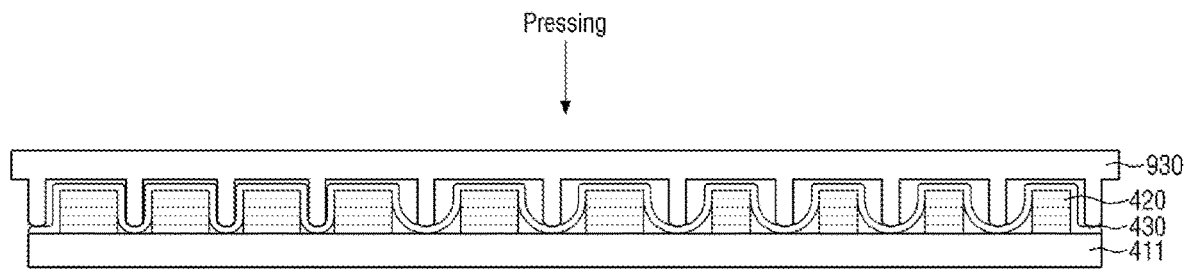

Subsequently, referring to FIG. 12, a tip 930 is inserted into the openings H in the heat radiation layer 420 from one surface (e.g., an upper surface) of the film layer 430. The process of inserting the tip 930 into the openings H may be a process of pressing the film layer 430 by using the tip 930 located at a position corresponding to the openings H. Accordingly, the film layer 430 may be closely attached to the inner wall of the openings H in the heat radiation layer 420, and the film layer 430 may contact the inner side wall of the heat radiation layer 420 and/or the first adhesive layer 411. Although FIG. 10 illustrates a method of pressing the film layer 430 by using the tip 930, the present invention is not limited thereto, and the film layer 430 may be closely attached to the inner side wall of the heat radiation layer 420 and one surface of the first adhesive layer 411 by using, for example, air pressure. Because the film layer 430 has been described above with reference to FIG. 4 and the like, a detailed description thereof will be omitted.

Figure 13:
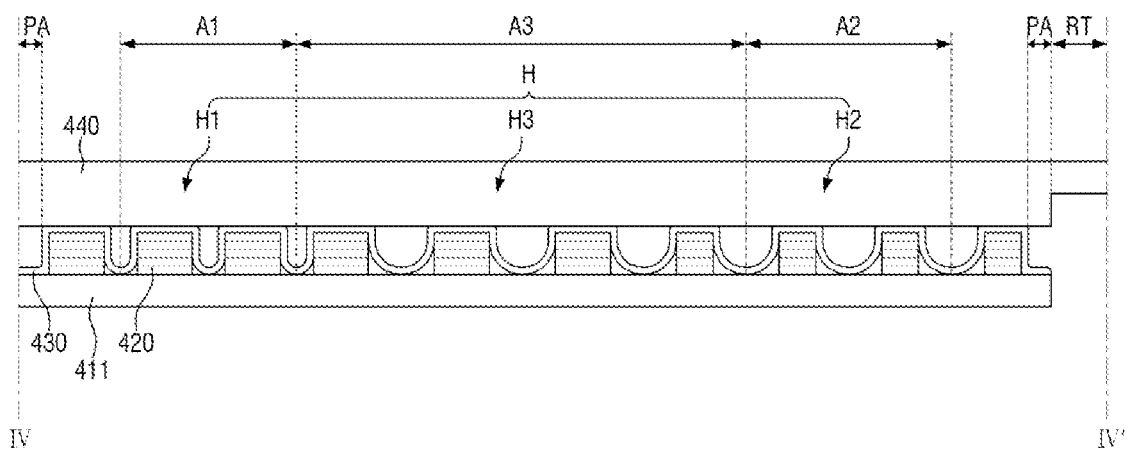

Subsequently, referring to FIG. 13, a protective layer 440 is formed on one surface (e.g., an upper surface) of the film layer 430 and cut to complete the heat radiation sheet 400. In an embodiment, the process of forming the protective layer 440 may be performed using a roll-to-roll process. An adhesive layer is further formed on one surface (e.g., a lower surface) of the protective layer 440, and the protective layer 440 may be attached to one surface (e.g., an upper surface) of the film layer 430 by the adhesive layer. Because the protective layer 440 has been described above with reference to FIG. 4 and the like, a detailed description thereof will be omitted.

As described above, according to the embodiments of the present invention, the interlayer coupling force of the heat radiation sheet is improved to impart excellent physical and mechanical properties to the heat radiation sheet, and defects, such as wrinkles and bubbles, may be prevented or substantially reduced to improve the reliability of the heat radiation sheet.

The aspects and features of the present invention are not limited by the foregoing, and other various aspects and features are anticipated.

Although some embodiments of the present invention have been disclosed herein for illustrative purposes, those skilled in the art will appreciate that various modifications, additions, and substitutions are possible without departing from the scope and spirit of the present invention as defined by the accompanying claims and their equivalents.

What is claimed is:

1. A heat radiation sheet comprising:
   a film layer;
   a heat radiation layer on the film layer and having a first area, a second area, and a third area and a plurality of openings therein, the openings comprising a plurality of first openings in the first area, a plurality of second openings in the second area, and a plurality of third openings in the third area; and
   a first adhesive layer on the heat radiation layer,
   wherein an average distance between adjacent ones of the first openings is smaller than an average distance between adjacent ones of the third openings.

2. The heat radiation sheet of claim 1, wherein the film layer at least partially contacts an inner side wall of the heat radiation layer in the openings and the first adhesive layer.

3. The heat radiation sheet of claim 1, further comprising a protective layer under the film layer and comprising a removal tab,
   wherein a shortest distance between the removal tab and a center of the first area is smaller than a shortest distance between the removal tab and a center of the third area.

4. The heat radiation sheet of claim 3, wherein the film layer comprises a protruding area,
   wherein the heat radiation layer does not overlap the protruding area, and
   wherein the film layer contacts the first adhesive layer in the protruding area.

5. The heat radiation sheet of claim 3, wherein a first space is formed between a first surface of the film layer and the protective layer, and a second space is formed between a second surface of the film layer and the first adhesive layer.

6. The heat radiation sheet of claim 3, wherein the first openings are more densely arranged than the third openings.

7. The heat radiation sheet of claim 6, wherein an average planar area of the first openings is larger than an average planar area of the second openings.

8. The heat radiation sheet of claim 1, wherein a center of the second area overlaps a high-temperature heat emitting member, and
   wherein an average planar area of the second openings is smaller than average planar area of the third openings.

9. The heat radiation sheet of claim 8, wherein an average distance between adjacent ones of the second openings is larger than an average distance between adjacent ones of the first openings.

10. The heat radiation sheet of claim 9, wherein the film layer comprises polyethylene terephthalate, and
    wherein the heat radiation layer comprises a carbon material.

11. A heat radiation sheet comprising:
    a protective layer;
    a film layer on the protective layer; and
    a heat radiation layer on the film layer, the heat radiation layer comprising an initial removal portion, a high-temperature portion, and a peripheral portion and having a plurality of openings therein, the openings comprising a plurality of first openings in the initial removal portion, a plurality of second openings in the high-temperature portion, and a plurality of third openings in the peripheral portion, wherein an average distance between adjacent ones of the first openings is smaller than an average distance between adjacent ones of the third openings.

12. The heat radiation sheet of claim 11, further comprising:
a first adhesive layer on the heat radiation layer; and
a filling layer between the film layer and the first adhesive layer,
wherein the openings are filled by the filling layer.

13. The heat radiation sheet of claim 12, wherein the filling layer comprises a depression portion having a concavely recessed surface, and
wherein the film layer directly contacts the depression portion.

14. The heat radiation sheet of claim 13, wherein the protective layer comprises a removal tab, the removal tab comprising an outwardly extending portion of the protective layer,
wherein a shortest distance between a center of the initial removal portion and the removal tab is smaller than a shortest distance between a center of the peripheral portion and the removal tab, and
wherein the first openings are more densely arranged than the third openings.

15. The heat radiation sheet of claim 14, wherein the high-temperature portion overlaps a high-temperature heat emitting member, and
wherein an average planar area of the second openings is smaller than an average planar area of the third openings.

16. The heat radiation sheet of claim 11, further comprising a filling layer between the film layer and the heat radiation layer,
wherein the openings are filled by the filling layer.

17. The heat radiation sheet of claim 16, wherein a maximum thickness of the filling layer is greater than a maximum thickness of the heat radiation layer, and
wherein the film layer does not contact an upper surface of the heat radiation layer.

18. The heat radiation sheet of claim 17, wherein the protective layer comprises a removal tab, the removal tab comprising an outwardly extending portion of the protective layer,
wherein a shortest distance between a center of the initial removal portion and the removal tab is smaller than a shortest distance between a center of the peripheral portion and the removal tab, and
wherein the first openings are more densely arranged than the third openings.

19. The heat radiation sheet of claim 18, wherein a center of the high-temperature portion overlaps a high-temperature heat emitting member, and
wherein an average planar area of the second openings is smaller than an average planar area of the third openings.

20. The heat radiation sheet of claim 19, wherein an average distance between adjacent ones of the second openings is larger than an average distance between adjacent ones of the first openings.

* * * * *